United States Patent [19]

Nagakubo et al.

[11] Patent Number: 5,421,953
[45] Date of Patent: Jun. 6, 1995

[54] METHOD AND APPARATUS FOR DIRECT BONDING TWO BODIES

[75] Inventors: Masao Nagakubo, Chiryu; Seiji Fujino, Toyota; Kouji Senda, Oobu; Tadashi Hattori, Okazaki, all of Japan

[73] Assignee: Nippondenso Co., Ltd., Kariya, Japan

[21] Appl. No.: 197,495

[22] Filed: Feb. 16, 1994

[30] Foreign Application Priority Data

Feb. 16, 1993 [JP] Japan ................................. 5-051555
Oct. 22, 1993 [JP] Japan ................................. 5-287648

[51] Int. Cl.6 ...................... H01L 21/306; B44C 1/22; B32B 31/00; C03C 15/00
[52] U.S. Cl. .................................. 216/34; 156/272.2; 156/379.6; 156/345; 216/62; 216/66; 216/69
[58] Field of Search ............... 156/629, 633, 636, 643, 156/651, 662, 645, 272.2, 272.6, 273.7, 379.6, 379.8, 345; 437/62, 225; 204/192.32

[56] References Cited

U.S. PATENT DOCUMENTS

| | | | |
|---|---|---|---|
| 4,671,846 | 6/1987 | Shimbo et al. | 156/629 |
| 5,100,839 | 3/1992 | Terao | 437/225 |
| 5,204,282 | 4/1993 | Tsuruta et al. | 437/62 |
| 5,223,450 | 6/1993 | Fujino et al. | 437/62 |

FOREIGN PATENT DOCUMENTS 62-027040  6/1987  Japan .
62-122148  6/1987  Japan .
0246722  2/1990  Japan .

OTHER PUBLICATIONS

G. Spierings et al, "Diversity And Interfacial Phenomena In Direct Bonding", pp. 18–33.
T. Suga, "Nikki New Materials", Joining Ceramics, with translation of pp. 74–75, Sep. 14, 1992.

*Primary Examiner*—William Powell
*Attorney, Agent, or Firm*—Cushman, Darby & Cushman

[57] ABSTRACT

Bodies of at least one material are held in a contacting holder 12 in a vacuum chamber. The surfaces of the bodies are cleaned by a low energy ion etching. Water vapor from a pure water bottle is supplied through a nozzle as a water molecule beam so that water molecules and hydroxide groups are chemically adsorbed on the surfaces of the bodies. A plasma beam or microwaves are applied to the surfaces of the bodies to remove the water molecules and leave only hydroxide groups remaining on the surfaces. The holder is operated to bring the surfaces of the bodies into contact with each other, to thereby obtain direct bonding of the bodies.

18 Claims, 6 Drawing Sheets

METHOD AND APPARATUS FOR DIRECT BONDING TWO BODIES

BACKGROUND OF THE INVENTION

1. Field of the Invention

The present invention relates to method and apparatus for direct bonding of two bodies which may be different materials. More specifically, in the present invention, two bodies are directly and firmly bonded by means of hydrogen bonds between hydroxide groups adsorbed on the surface of one body and oxygen atoms on the surface of the other body. This invention is characterized in that the bonding can be conducted at room temperature under a low pressure without heating in a vacuum so that it is applicable to bonding between heterogeneous materials. The present invention may be applied to precise bonding between mechanically or thermally brittle functional parts such as micro sensors and IC chips.

2. Description of Related Art

Direct bonding of silicon wafers has been known, for example, in Japanese Unexamined Patent Publication (Kokai) No. 2-46722, Japanese Examined Patent Publication (Kokoku) No. 62-27040, and Japanese Unexamined Patent Publication (Kokai) Nos. 62-122148 and 48-40372. FIGS. 1A to 1D illustrate a schematic model of the conventional bonding method. In this method, the surfaces of silicon wafers are preliminarily mirror polished, treated in a mixture of $H_2SO_4$ and $H_2O_2$ solutions to make the surfaces of the wafers hydrophilic (to adsorb hydroxide groups), and brought into intimate or close contact with each other at room temperature while water is present between them, as shown in FIG. 1A. The wafers are then thermally treated to remove water between the wafers and bond the wafers through hydrogen covalent bonds, as shown in FIGS. 1B to 1D.

In this method, the thermal treatment requires a high temperature of above 300° C., sometimes above 1000° C. As a result, if this method is applied to bonding between materials having different thermal expansion coefficients, the bond between such materials is deteriorated due to the difference of the thermal expansion coefficient. Moreover, the hydroxide groups-adsorbing step is a wet process conducted in an aqueous solution and therefore cannot be carried out successively with a dry process conducted in a vacuum chamber.

The room temperature bonding of heterogeneous materials has been investigated using a process similar to the above one (leveling and affinity treatment in wet conditions), for example, that explained by J. Haisma and G. A. C. M. Spierings in "DIVERSITY AND INTERFACIAL PHENOMENA IN DIRECT BONDING", Proceedings of the 1. International Symposium on Semiconductor Wafer Bonding. Sci.-Tech. and Appl. (1992), p.18. This process relates to bonding between a mirror polished silica glass ($SiO_2$) and materials deposited on a silicon wafer (Ta, Ti, Cu, W and so on). Heat treatment was not carried out since the thermal expansion coefficients of the materials to be bonded are different.

The effectiveness of this method however greatly depends on the materials. For example, tungsten cannot be bonded and copper can be bonded only under a substantial pressure. The reasons for these are not clear. Further, the reliability of the bonding is not high. This method therefore cannot be applied to bonding of bulks in practice.

The room temperature bonding of heterogeneous materials is also known in NIKKEI NEW MATERIALS, Sep. 14, 1992, pp.74-75. In this disclosed method, the surface of a material to be bonded is activated by applying a high speed beam of neutral atoms of an inert gas such as argon to remove an impurity layer from the surface of the material. The bonding is done by mounting a ceramic material onto the activated material and applying a pressure of about 10 to 20 MPa to the assembly. This method still has problems in industrial applications, since the pressure for bonding is as high as about 10 to 20 MPa and the presence of an amorphous layer 5 to 10 nm thick at the bonding interface causes a change in the electric properties at the bonding interface.

SUMMARY OF THE INVENTION

The object of the present invention is therefore to provide a method and apparatus for direct bonding of two materials in a vacuum at room temperature under a low pressure without heating.

The present inventors have investigated the conventional direct bonding method as described above. When bonding is conducted at room temperature in the conventional method, it is considered that the silicon wafers are held by a network of hydrogen bonds of water molecules between silicon wafers at room temperature, as shown in FIG. 1A. Here, the bonding has a sufficiently high tensile strength in the direction perpendicular to the bonding surfaces due to hydrogen bonds but is very weak in the direction parallel to the bonding surfaces because the water molecules and thus the hydrogen bonds are continuously moving and are not fixed at a certain place. Thus, this bonding is not practically useful.

For the conventional bonding as described above, a model was advocated in which after the wafers are heated to above 200° C., each hydroxide group on the surface of one wafer has a bond with a certain hydroxide group on the other wafer, as shown in FIG. 1B. At above 700° C., as shown in FIG. 1C, dehydration condensation occurs to form Si—O—Si bonds, which correspond to the respective hydrogen bonds between the hydroxide groups as shown in FIG. 1B. At above 1000° C., oxygen atoms diffuse out to form direct bonds between the silicon wafers as shown in FIG. 1D. In this model, the bonds between the hydroxide groups, as shown in FIG. 1B, have a very low flexibility and, therefore, bonding between heterogeneous materials is difficult since the distributions of hydroxide groups on the surfaces of the heterogeneous materials are different.

The present inventors propose a new model which is described with reference to FIGS. 2A to 2D. As shown in FIG. 2A, when the surface of a body of a material to be bonded is cleaned by applying inert gas ions such as argon ions to remove impurity atoms from the surface, the surface of the body is activated by creating dangling bonds there. Referring to FIG. 2B, hydroxide groups and water molecules are then adsorbed on the surface of the body in a vacuum. Referring to FIG. 2C, the water molecules are then removed so that only hydroxide groups remain on the surface of the body. When the surfaces of two bodies are brought in contact with each other, the hydrogen atoms of the hydroxide groups adsorbed to the surface of the lower body form hydrogen bonds with oxygen atoms (the oxygen atoms of hydroxide groups or oxides) on the surface of the upper body, as shown in FIG. 2D, so that the bodies are firmly bonded to each other.

In this model, as long as the surfaces of two bodies complementarily correspond to each other and can chemically adsorb hydroxide groups, the bodies can be firmly bonded without providing water molecules at the bonding interface. The present inventors discovered that if hydroxide groups are adsorbed to the surfaces of bodies to be bonded, hydrogen bonds between hydroxide groups on the respective surfaces of bodies and oxygen atoms on the opposite surfaces of the bodies, can be obtained at room temperature, and these hydrogen bonds have a sufficiently high bonding strength. In this model, the hydrogen bonds are fixed on the surfaces of the bodies and the flexibility of the hydrogen bonds is equivalent to that of the bonds in the bodies, so that the bonds provide a practically sufficient strength.

Thus, the present invention provides a method for direct bonding of two bodies of at least one material, the method comprising a first step (cleaning step) of preparing two bodies having surfaces which complementarily correspond to each other and can become in intimate or close contact with each other and cleaning the surfaces of the bodies in a vacuum atmosphere; a second step (hydroxide groups adsorbing step) of causing the cleaned surface of at least one of the bodies to chemically adsorb hydroxide groups; and a third step (bonding step) of bringing the surfaces of the bodies into contact with each other and bonding the bodies through hydrogen bonds between the hydroxide groups on the surface of the at least one body and oxygen atoms present on the surface of the other body.

In this method, the first step may be conducted by either ion etching or sputter etching.

The second step may comprise a fourth step of spraying water molecules onto the at least one surface of the bodies in a vacuum to cause water molecules and hydroxide groups adsorbed onto the at least one surface of the bodies, and a fifth step of applying an energy to the at least one surface of the bodies, the energy being just as high as necessary to remove the water molecules from the at least one surface of the bodies and leave hydroxide groups remaining on the at least one surface of the bodies (preferably water should not remain and only hydroxide groups remain).

The fifth step may be conducted by applying a plasma beam or microwaves to the at least one surface of the bodies. The fifth step may be also conducted by applying radio frequency waves or a DC voltage to at least one of the bodies so as to decompose and remove the water molecules from the at least one surface of the bodies by the effect of an electromagnetic field generated by the radio frequency wave or direct electric voltage, and to leave hydroxide groups remaining on the at least one surface of the bodies. The second step may comprise creating a plasma beam comprising ions of an inert gas for generating plasma and at least one hydrogen-containing reactive gas and applying the plasma beam to the at least one surface of the bodies to cause the at least one surface of the bodies to adsorb hydroxide groups.

The second step may comprise applying a radio frequency waves or a DC to water molecules to decompose the water molecules into hydroxide groups by an electromagnetic field generated thereby or a plasma energy generated by the electromagnetic field, and spraying the formed hydroxide groups onto the at least one surface of the bodies to adsorb the formed hydroxide groups onto the at least one surface of the bodies.

The second and third steps may comprise applying water molecules onto the at least one surface of the bodies in a vacuum to cause the water molecules adsorbed onto the at least one surface of the bodies, then bringing the surfaces of the bodies into contact with each other with the water molecules being present between the surfaces of the bodies, and then applying either radio frequency waves or a DC to the bodies to remove water molecules from the surfaces of the bodies by the effect of an electromagnetic field generated thereby, to thereby bond the bodies.

The second step may comprise introducing water vapor into the vacuum atmosphere, ionizing the water vapor and spraying the ionized water vapor onto the at least one surface of the bodies, to thereby cause the hydroxide groups to be adsorbed onto the at least one surface of the bodies.

The third step may comprise, after the second step, bringing the surfaces of the bodies into contact with each other by means of contacting equipment, and heating the bodies in a heating chamber at a predetermined temperature for a predetermined time period, to remove water molecules present between the contacted surfaces of the bodies.

The present invention also provides an apparatus for direct bonding of two bodies of at least one material, comprising a vacuum chamber; a first means for holding two bodies to be bonded while surfaces of the bodies are exposed and for, by a subsequent operation, bringing the surfaces of the bodies into contact with each other in the vacuum chamber; a second means for causing the surfaces of the bodies to adsorb hydroxide groups in the vacuum chamber; and a third means for operating the first means to bring the surfaces of the bodies into contact with each other in the vacuum chamber.

In the apparatus, the second means may comprise a means for spraying water molecules onto at least one of the surfaces of the bodies, and a means for applying a beam of an inert gas plasma generated by microwaves to the at least one surface of the bodies.

The second means comprise a plasma generating means for generating plasma of an inert gas and applying a beam of the generated plasma to at least one of the surfaces of the bodies, and a means for introducing at least one reactive gas including hydrogen to the plasma generating means to generate the plasma beam comprising ions of the at least one gas.

The second means may comprise a means for spraying water molecules onto at least one of the surfaces of the bodies, and a means for applying a radio frequency wave or direct electric current to the water molecules spraying means so as to decompose the water molecules to hydroxide groups by a magnetoelectric field of the radio frequency waves or DC or by a plasma energy generated by the magnetoelectric field and for spraying the formed hydroxide groups from a nozzle of the spraying means to the at least one of the surfaces of the bodies.

The second means may comprise a means for spraying water molecules onto at least one of the surfaces of the bodies, and a means for applying radio frequency waves or DC through the first means to the bodies so as to decompose and remove the water molecules on the at least one of the surfaces of the bodies.

The second means may comprise a pure water tank from which water vapor is introduced into the vacuum chamber, and a means for ionizing the water vapor, and spraying the ionized water vapor onto the at least one of the surfaces of the bodies so that hydroxide groups are adsorbed on the at least one of the surfaces of the bodies.

In the above method and apparatus, when the surfaces of bodies to be bonded are cleaned by applying inert gas ions such as argon ions thereto, the impurities are removed and dangling bonds are created on the surfaces of bodies to be bonded. After the two bodies to be bonded are then brought into contact with each other, the bodies are firmly bonded through hydrogen bonds between hydrogen atoms of hydroxide groups on the surface of one body and oxygen atoms on the surface of the other body. By adsorbing hydroxide groups on the surfaces of bodies, the densities of hydrogen bonds at the bonding interface can be increased and a reliable high strength bonding between the bodies can be easily obtained at room temperature under a low pressure.

The present invention may be applied to any materials which have affinity with oxygen atoms, and includes most metals such as aluminum, titanium, tantalun, copper, chromium, nickel, silver, zirconium, lead, tin, tingsten and iron, except for particular elements such as gold, and also includes organic polymers such as polytetrafluoroethylene, polystylene, polyethylene and polyimide, and ceramics such as $Al_2O_3$, $SiO_2$, $PbZrTiO_x$, $YBa_2Cu_3O_x$ and $Bi_2Sr_2Ca_2Cu_3O_x$.

DESCRIPTIONS OF PREFERRED EMBODIMENTS

Figure 1A:
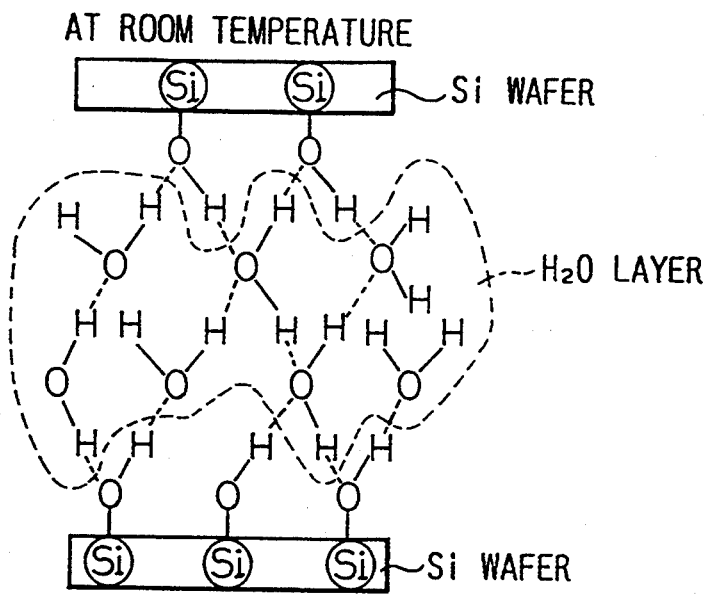
FIGS. 1A to 1D show a schematic model of a conventional method for direct bonding two materials.
Figure 1B:
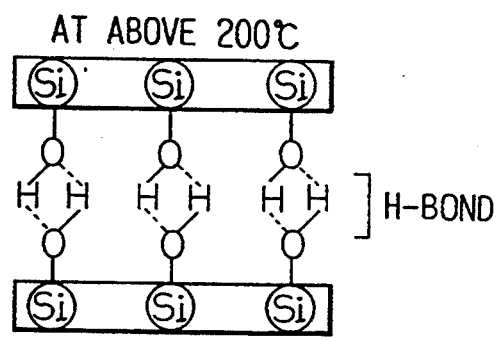
Figure 1C:
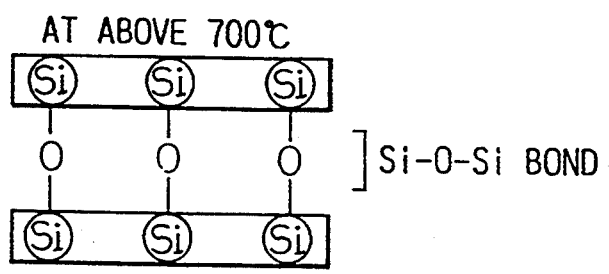
Figure 1D:
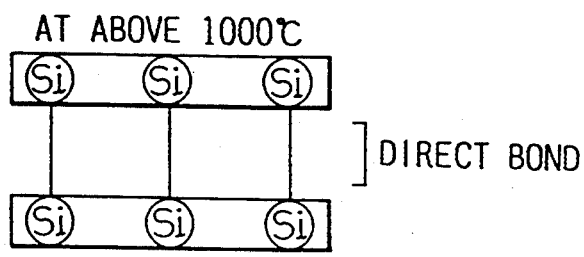

A first embodiment of the present invention is described with reference to FIGS. 3 and 4.

An apparatus is described with reference to FIG. 3, in which a vacuum chamber 11 is evacuated to about $10^{-4}$ Pa through a port 16 by a vacuum pump. In the right portion of the vacuum chamber 11, a contacting holder (holding and contacting means) 12 is provided. As shown in FIG. 4, the contacting holder 12 comprises arm portions 12A and a joint portion 12B. The arm portions 12A can hold bodies to be bonded, with the surfaces of the bodies which have been preliminarily mirror polished being exposed. The joint portion 12B is rotably connected to the arm portions 12A. When the arm portions 12A are rotated by the joint portion 12B, the surfaces of the bodies 13 and 14 to be bonded can be brought into parallel contact with each other. This operation of rotation is performed by means of an operational lever 12C (operation means) from the exterior. The load applied to the surfaces of the bodies to be bonded can also be controlled. In the upper portion of the vacuum chamber 11, an ion source 21 is provided, by which the surfaces to be bonded are ion etched and cleaned. An inert gas such as argon is introduced into the ion source 21 through a means 23 for supplying an inert gas.

When the ion source 21 is operated, the inert gas is ionized and applied as an ion beam 22 to the surfaces of the bodies 13 and 14 to be bonded. The ion energy is set at as low a level as possilbe so as not to reduce the smoothness of the surfaces of the bodies, for example, 100 to 200 eV and the time period for etching is set as long as necessary to remove a superficial layer about 10 nm thick, from the bodies 13 and 14 (cleaning step).

The method for cleaning the surfaces of the bodies may be, for example, sputter etching. In this case, a DC power or radio frequency waves are supplied to the bodies 13 and 14 to be bonded from an external bias power source 50, by which sputter etching is conducted with the bodies being used as the cathode.

The means for causing hydroxide groups chemically adsorbed onto the surfaces of the bodies 13 and 14 (hydroxide group adsorbing means) is described next.

Water molecule spraying nozzles 41 are provided in a lower portion of the vacuum chamber 11 and the ends of the nozzles 41 are directed toward the respective mirror polished surfaces of the bodies 13 and 14 to be bonded (water spraying means). Referring to FIG. 4, the water molecule spraying nozzles 41 are connected to an external pure water bottle 43 and water vapor is introduced into the nozzles 41 from the pure water bottle 43. As a result, water molecule beams 42 as the water vapor from the ends of the nozzles 43 are sprayed to the surfaces of the bodies 13 and 14. The water vapor is generated and introduced into the vacuum chamber due to a difference between the pressure in the vacuum chamber and the atmospheric pressure. (water vapor spraying step)

Figure 3:
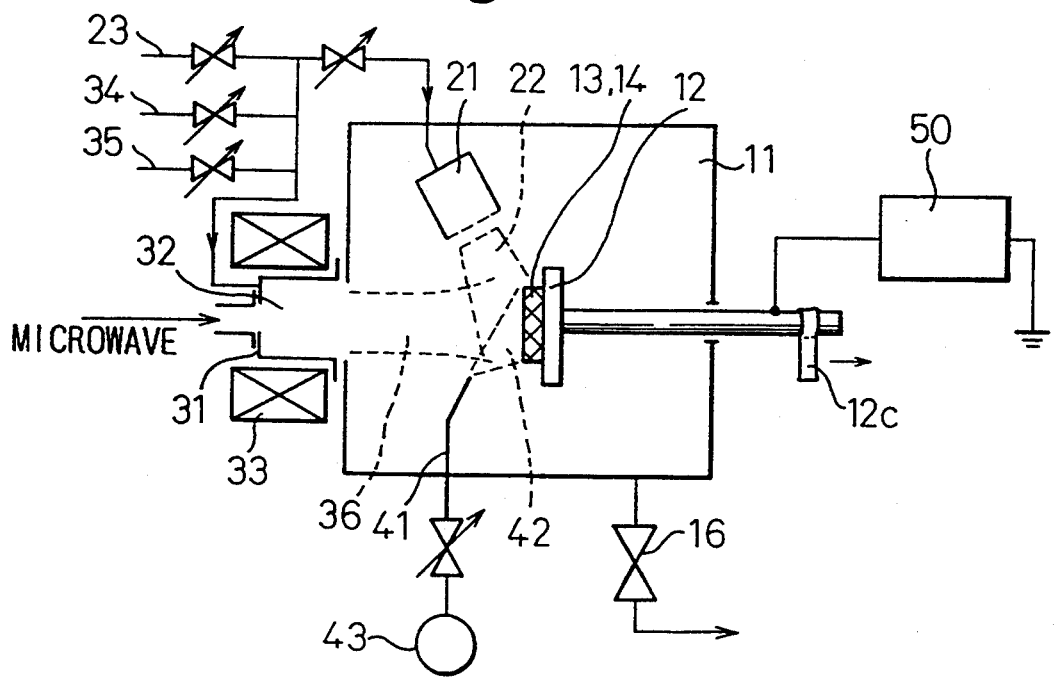
FIGS. 3 to 8 illustrate schematic cross-sectional views of apparatus for direct bonding in a vacuum in the embodiments of the present invention.
Figure 4:
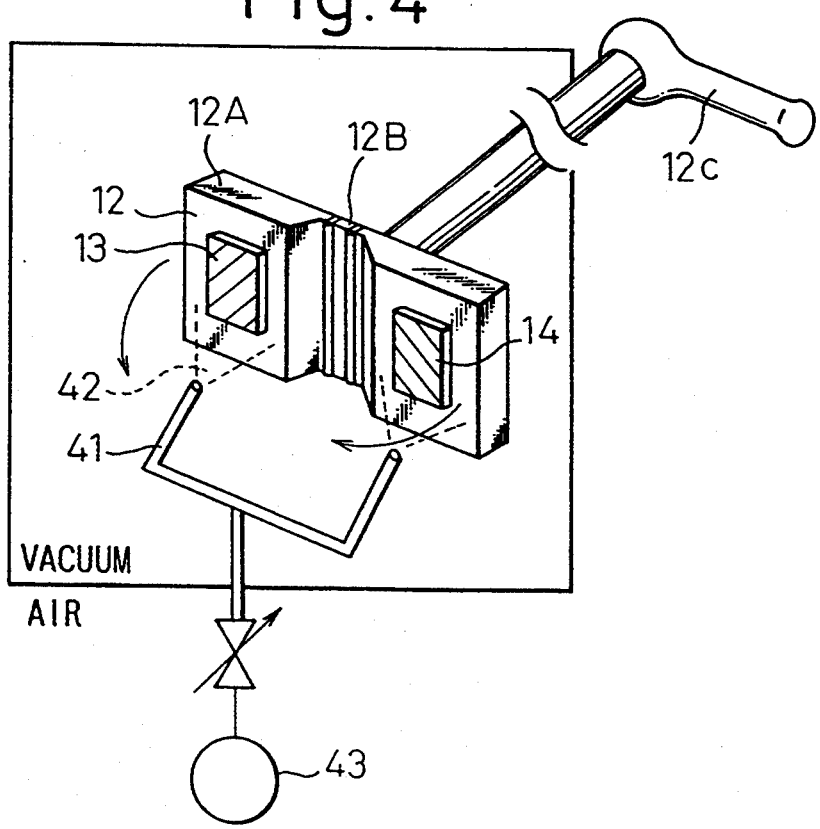

In FIG. 3, in the left portion of the vacuum chamber 11, an ECR (electron cyclotron resonance)-type plasma generating source 31 is provided as a water-removing means. The ECR type plasma generating source 31 comprises an ionizing chamber communicating with the vacuum chamber 11 and an electromagnetic coil 33 for providing a magnetic field into the ionization chamber 32. Microwaves generated in a magnetron (not shown) are introduced into the ionizing chamber 32 through a waveguide.

The ionizing chamber 23 communicates with an inert gas supply means 23 for supplying an inert gas as a discharging gas and reactive gas supply means 34 and 35 (reactive gas introducing means) for supplying reactive gases such as hydrogen and oxygen, by which respective gases can be supplied to the ionizing chamber 32. In the ionizing chamber 32, the introduced gas mixture is excited and ionized by the microwave discharge to generate plasma. Here, the frequency of the microwaves introduced into the ionizing chamber 32 coincides with the cyclotron resonance frequency of electrons determined by the magnetic field of the electromagnetic coil 33, by which the electrons in the gaseous molecules are resonantly accelerated so that the gaseous molecules are excited and ionized to generate plasma. The plasma thus generated in the ionizing chamber 32 is injected as a plasma beam 36 through the opening of the ionizing chamber 32 toward the bodies to be bonded 13 and 14 in the vacuum chamber 11. The energy of the plasma beam 36 is set at as high as necesasry to remove the water molecules on the surfaces of the bodies 13 and 14 but not so high as to raise the temperature of the bodies 13 and 14, for example, about 10 eV (water molecules removing step).

The plasma generating means 31 may be used not only as a water molecules removing means but also as a part of a hydroxide group adsorption causing means. In this case, in addition to an inert gas, reactive gases such as oxygen and hydrogen are introduced in the ionizing chamber 32 from the reactive gas supply means 34 and 35, by which active ions such as oxygen ions and hydrogen ions are included in the plasma beam 36. As a result, the surfaces of the bodies 13 and 14 adsorb not only hydroxide groups supplied from the water molecule spraying means 41 but also hydroxide groups supplied by the plasma beam 36, so that the hydroxide groups can be adsorbed on the surfaces of the bodies in a higher density. If the efficiency of providing hydroxide groups to the surfaces of the bodies by the reactive gas plasma is increased, the water molecules spraying step may be eliminated. In this case, as the water molecules spraying step may be eliminated, the contamination of the vacuum chamber and the bodies to be bonded with water molecules can be avoided and the bonding can be conducted under clean conditions.

The water molecules removing step may be conducted by a magnetron (not shown). In this case, microwaves are introduced into the vacuum chamber 11 through the plasma generating source 31 without generating plasma therein. As a result, the water molecules adsorbed on the surfaces of the bodies 13 and 14 are vigorously vibrated by the vibrating electric field caused by the microwaves, to thereby remove only the water molecules and leave hydroxide groups remaining on the surfaces of the bodies 13 and 14. This is derived from the fact that the water molecules are polar molecules and this property is utilized in this process.

Next, the method for direct bonding of bodies 13 and 14 using the above apparatus as well as the schematic model of FIGS. 2A to 2D are described.

Figure 2A:
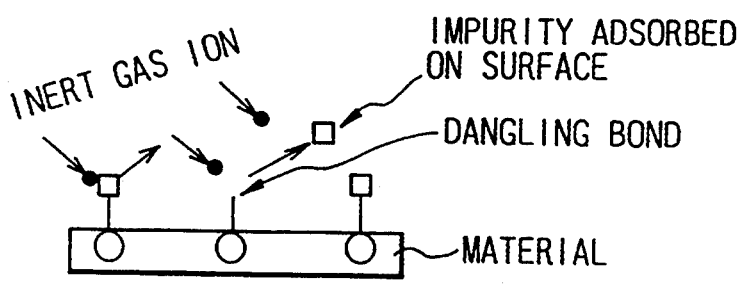
FIGS. 2A to 2D shows a schematic model of the method for direct bonding two materials of the present invention.

First, the surfaces of aluminum (Al) and silicon (Si), as bodies to be bonded 13 and 14 respectively, are preliminarily mirror polished. Referring to FIGS. 3 and 4, the bodies of the aluminum (Al) and silicon (Si) are held in the contacting holder 12 in the vacuum chamber 11 while the surfaces of the bodies 13 and 14 to be bonded are exposed. The step of cleaning the surfaces of the bodies 13 and 14 is then conducted. Namely, by operating the ionizing source 21, an inert gas is ionized and applied as an ion beam 22 having a certain energy to the surfaces of the bodies 13 and 14. The superficial layer about 10 nm thick from the exposed surfaces of the bodies 13 and 14 is removed and the exposed surfaces of the bodies 13 and 14 are cleaned. In this step, many dangling bonds are created on the cleaned surfaces of the bodies 13 and 14 as shown in FIG. 2A. If the cleaned bodies are left for a while after the cleaning step, even if the vacuum chamber 11 is maintained under a high vacuum, impurities such as nitrogen, carbon and hydrocarbons are chemically adsorbed on the cleaned surfaces of the bodies 13 and 14 and the cleaned surfaces become deactivated, since these dangling bonds are very active. Accordingly, the hydroxide groups adsorbing step is started before the cleaning step finishes.

Figure 2B:
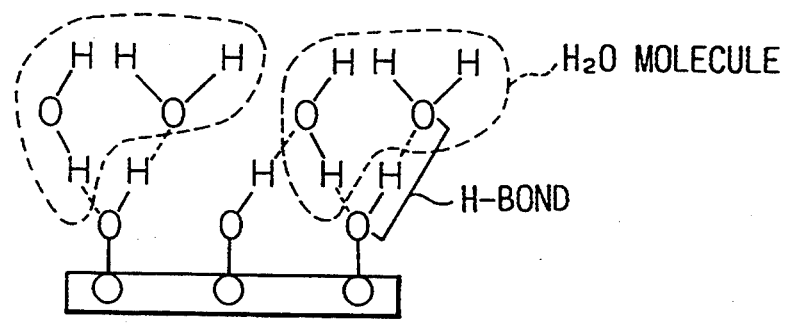

In the hydroxide groups adsorbing step, water vapor as water molecule beams 42 is sprayed toward the surfaces to be bonded from the ends of the water molecule spraying nozzles 41. As a result, the surfaces of the bodies 13 and 14 are covered with a first layer of hydroxide groups and then a second layer of water molecules bonded with the hydroxide groups of the first layer, as shown in FIG. 2B.

Figure 2C:
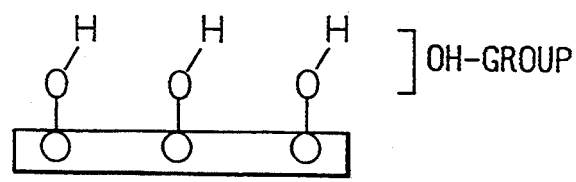

The water molecule removing step follows. In this step, a plasma beam 36 or microwaves are applied to the surfaces of the bodies 13 and 14. If a plasma beam 36 or microwaves are applied to the surfaces of the bodies 13 and 14 while the surfaces of the bodies 13 and 14 are covered with hydroxide groups and water molecules, by the energy of the plasma, the water molecules are removed and only hydroxide groups remain on the surfaces of the bodies 13 and 14 without raising the temperature of the bodies 13 and 14, as shown in FIG. 2C. This step is conducted to obtain a sufficient bonding strength after the bonding. Namely, even if the hydroxide groups are adsorbed in a high density onto the surfaces of the bodies 13 and 14, if this state is maintained for a while, the surfaces of the bodies soon become covered with impurities present in the vacuum chamber 11 and in the water and it is difficult to obtain a reliable bonding in the later bonding step. Thus, in order to maintain the activity of the hydroxide groups, the water molecules as mentioned above should be removed. Nevertheless, if the application of an energy to the surfaces of the bodies 13 and 14 is maintained for a long time period, the temperature of the bodies is raised and therefore the water removing step should be finished in a short time period. Also, this application of an energy should continue until the bonding finishes. Note that the application of an energy of plasma or microwaves prevents readsorption of water molecules as well as other impurities so that the activity of the hydroxide groups is maintained on the surfaces for a long time.

Figure 2D:
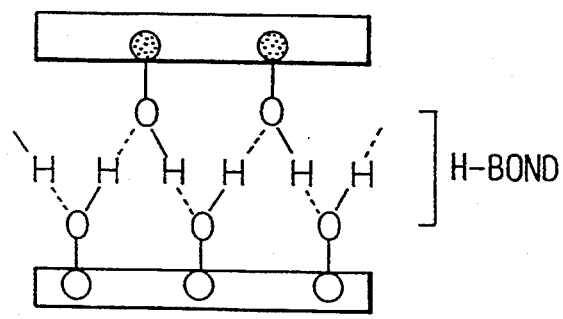

Next, the bonding step is conducted while the activity of the hydroxide groups adsorbed on the surfaces to be bonded of the bodies 13 and 14 is maintained. That is, the contacting holder 12 is operated by means of a lever 12C from outside of the vacuum chamber 11, to bring the surfaces of the bodies 13 and 14 into contact with each other (an example of the mechanism for this contact can be seen in FIG. 6). As a result, as shown in FIG. 2D, hydrogen bonds are formed between hydrogen atoms of the hydroxide groups on the respective surfaces of the bodies 13 and 14 and oxygen atoms on the opposite surfaces of the bodies 13 and 14, and the bonding of the bodies 13 and 14 finishes. Here, if the surfaces of the bodies 13 and 14 are previously made sufficiently smooth or if the bodies very precisely and complementarily correspond to each other, a reliable bonding with a high bonding strength can be obtained under an extremely low pressing pressure, for example, about 0.5 MPa. This is because the density of the hydrogen bonds between the hydroxide groups and the oxygen atoms is increased as the contact between the two surfaces of the bodies 13 and 14 is made more intimate or precise (as the area of the contact between the two surfaces of the bodies in the microstructure is increased).

Although the bonding may be conducted by bringing the surfaces of the bodies into contact with each other with not only hydroxide groups but also water molecules remaining on the surfaces of the bodies, the water molecules remaining at the bonding interface may lower the bonding strength and the reliability of the bonding. Therefore, a mechanism for removing water molecules is provided in this embodiment.

The provision of the water molecule spraying nozzles 41 in the vacuum chamber 11 allows the controlled spraying of water molecules onto the surfaces of the bodies 13 and 14 in a necessary and sufficient amount without contamination of the vacuum chamber and the evacuating pump.

(Second Embodiment)

In the first embodiment, the adsorption of hydroxide groups onto the surfaces of the bodies to be boned is conducted by first spraying water molecules by means of spray nozzles 41 followed by removing only water molecules to leave hydroxide groups remaining on the surfaces of the bodies 13 and 14. In this embodiment, hydroxide groups are directly sprayed from water molecule spraying nozzles.

Figure 5:
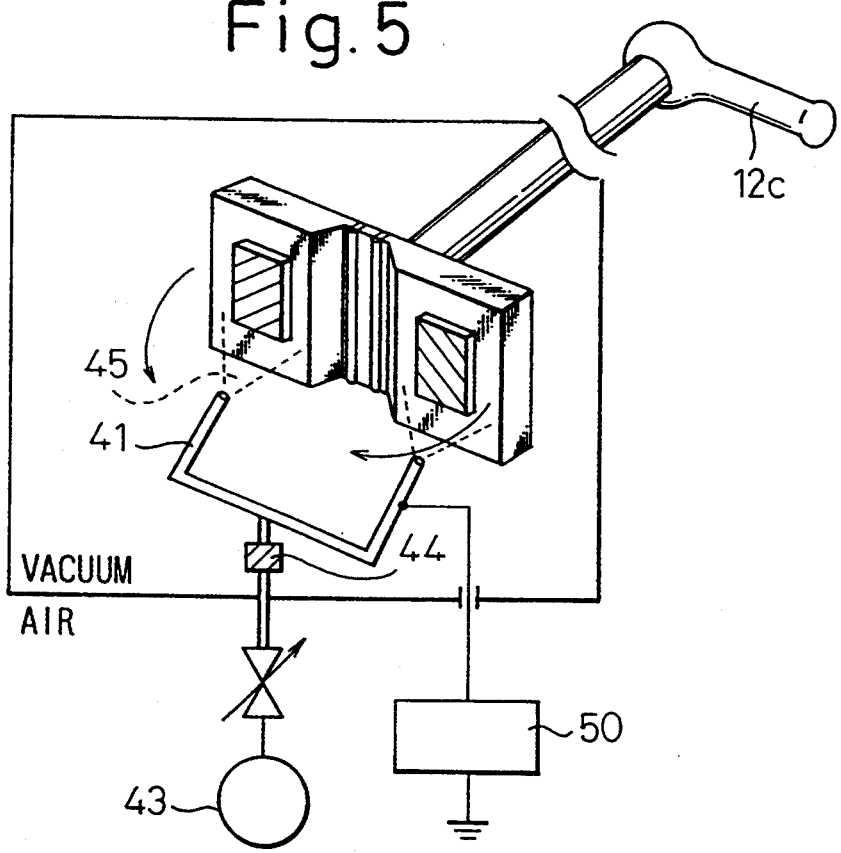

Referring to FIG. 5, the water molecule spraying nozzles 41 are electrically insulated by means of an insulating tube 44 and a bias power source 50 for radio frequency waves or DC is connected to the water molecule spraying nozzles 41 (hydroxide groups providing means). As a result, an electromagnetic field generated by the bias power source 50 for radio frequency waves or DC, or an energy of a plasma generated by that electromagnetic field, decomposes water molecules near the outlets of the nozzles 41 so that hydroxide group beams are directly sprayed to the surfaces of the bodies 13 and 14. Here, it is possible to apply microwaves or a plasma beam as generated in the first embodiment may be also applied to the surfaces of the bodies 13 and 14, in order to avoid deactivation of the hydroxide groups due to adsorption of impurities onto the surfaces of the bodies 13 and 14. The other constructions and process steps are the same as in the first embodiment and the descriptions thereof are eliminated.

As in this embodiment, if a radio frequency wave or a direct current is applied to the water molecule spraying nozzle 41 so that water molecules are decomposed by the energy of the electromagnetic field generated by the radio frequency waves or direct current and hydroxide groups (not water molecules) are adsorbed on the surfaces of the bodies 13 and 14, only hydroxide groups can be conveniently adsorbed on the surfaces of the bodies 13 and 14 to be bonded and the load for the vacuum system is also lowered.

(Third Embodiment)

Figure 6:
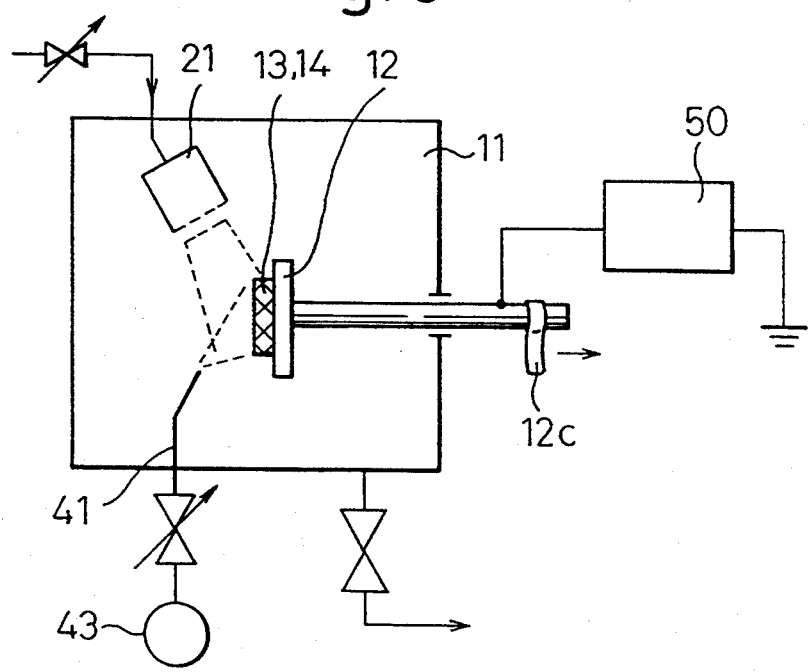

In this embodiment, referring to FIG. 6, as a means for causing hydroxide group adsorption, a bias power source 50 for radio frequency waves or a direct current is connected to the contacting holder 12 by which an electric energy of radio frequency waves or a direct current is applied to the bodies 13 and 14 to be bonded through the contacting holder 12. As a result, by an electromagnetic field generated thereby or an energy of a plasma generated by that electromagnetic field, water molecules adsorbed on the surfaces of the bodies 13 and 14 to be bonded can be removed so that only hydroxide groups remain.

(Water Molecule Decomposing Means)

Since in this embodiment, if radio frequency waves or a direct current is directly applied to the bodies 13 and 14 to be bonded so that water molecules adsorbed on the surfaces of the bodies 13 and 14 to be bonded are removed and only hydroxide groups remain, the apparatus construction is very simple and the cost for bonding may be lowered.

(Forth Embodiment)

Figure 7:
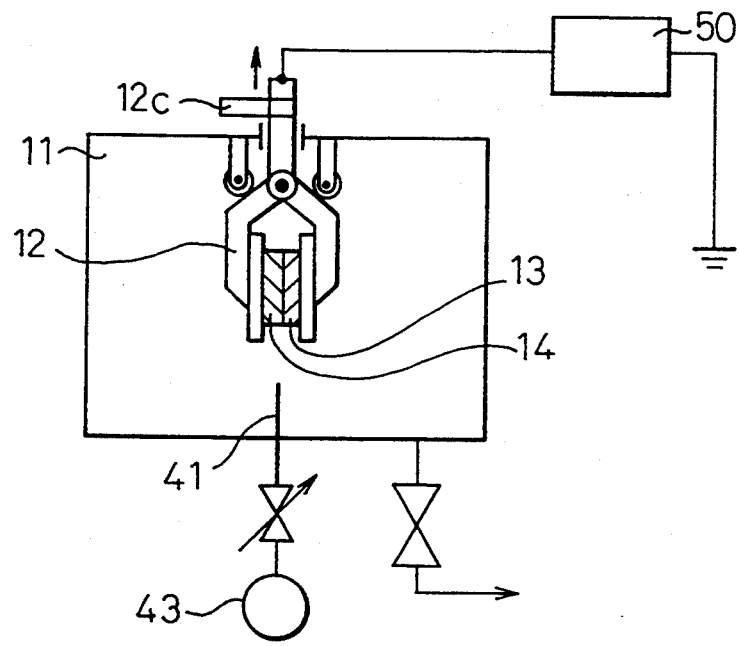

In the first to third embodiments, activation of the surfaces of the bodies by adsorbing hydroxide groups thereon is conducted before bringing the surfaces of the bodies into contact with each other. In the fourth embodiment, referring to FIG. 7, once the bodies to be bonded 13 and 14 are brought into contact with water molecules interposed therebetween, the water molecules are removed to conduct bonding. In this case, after water molecule beams are sprayed onto the bodies 13 and 14 from the water molecule spraying nozzles 41, without removing the water molecules, the contacting holder 12 is operated to bring the surfaces of the bodies into contact with each other. The bodies 13 and 14 are bonded through the water molecules. To the bodies 13 and 14 in this state, radio frequency waves or a direct electric current is applied from a bias power source 50, so that the water molecules are removed from the bonding surfaces of the bodies by an electromagnetic field generated thereby, to form many hydrogen bonds between hydroxide groups and oxygen atoms at the bonding interface and thus obtain a firm bond between the bodies.

In the fourth embodiment, since the bonding is obtained by first adsorbing water molecules and hydroxide groups on the bodies to be bonded, bringing these bodies into contact and bonding the bodies with the water molecules therebetween, and then applying radio frequency waves or DC to the bodies so as to decompose and remove water molecules from the bonding interface, to thereby form hydrogen bonds between said hydroxide groups and oxygen atoms, the step of the removal of water molecules for strengthening the bonding and the step of bonding may be separated and conducted non-sequentially. This broadens the width of choices for processing for bonding, depending on products to be bonded.

(Fifth Embodiment)

Figure 8:
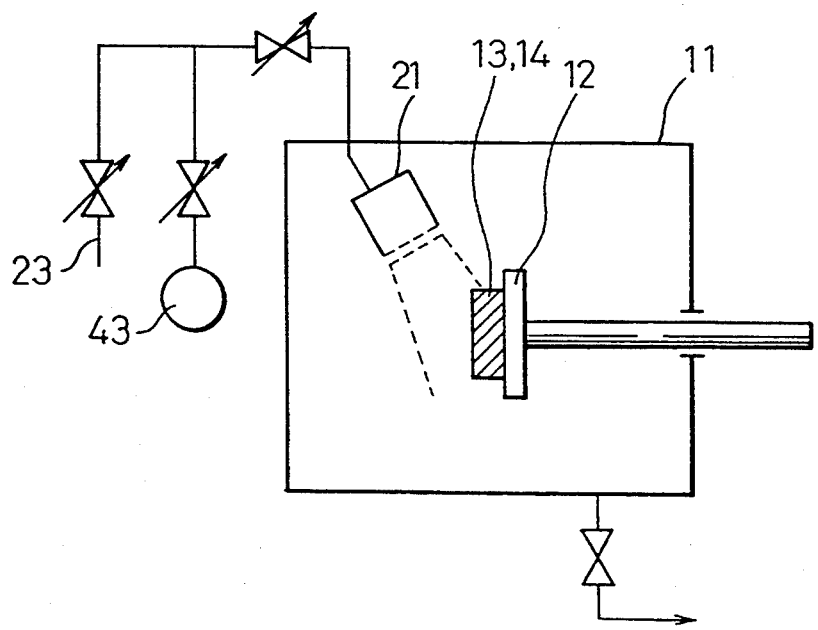

As a means for causing hydroxide group adsorption, referring to FIG. 8, water vapor is introduced from a pure water bottle 43 directly to an ion source 21 and is ionized by applying an adequate energy (about 50 to 1000 V voltage) thereto, so that hydroxide groups are chemically adsorbed on the surfaces of the bodies. After the chemical adsorption, the bodies may be brought into contact and bonded by the contacting holder 12 in the vacuum chamber 11 in various manners as in the other embodiments. Further, if it is acceptable for the bodies to be heated, the bodies may be heated at an adequate temperature in the vacuum chamber 11 after being brought into contact with each other, so that excess water molecules existing at the bonding interface can be removed, to improve the contact and increase the contact area.

In this embodiment, in addition to water vapor, an inert gas such as argon is introduced at an adequate partial pressure into the ionizing source 21 from an inert gas supply means 23, so that cleaning of the surfaces of the bodies 13 and 14 and adsoption of hydroxide groups are simultaneously carried out, in order to improve the efficiency of the hydroxide groups adsorption. Further, if the bodies 13 and 14 to be bonded are insulating materials such as ceramics, a filament may be ignited near the ion exit port of the ion source 21, so that ions can be neutralized by electrons emitted from the filament (so-called neutralizer mechanism), in order to improve the efficiency of hydroxide groups adsorption.

(Sixth Embodiment)

Figure 9A:
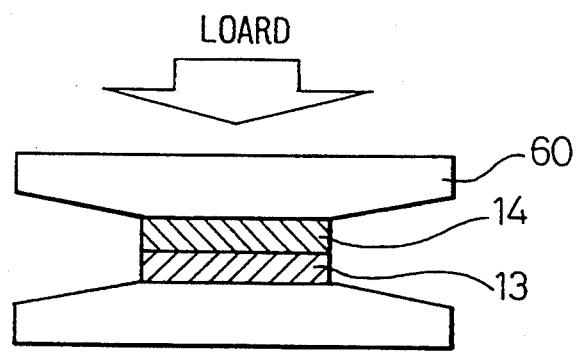
FIG. 9A shows a schematic view of pressure contacting equipment in the sixth embodiment.
Figure 9B:
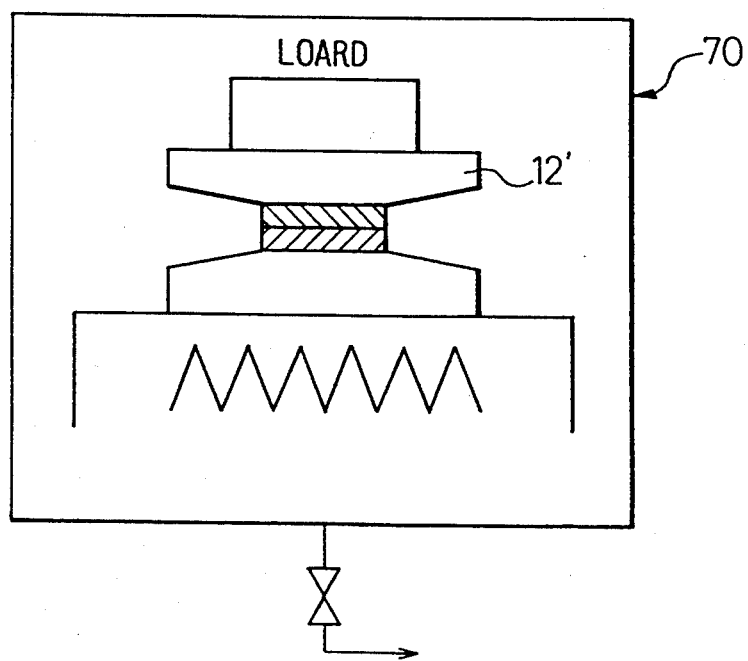
FIG. 9B shows a schematic view of a heat treatment chamber in the sixth embodiment.

Alternatively, after hydroxide groups are adsorbed onto the bodies 13 and 14 in the manner as described before, the bodies 13 and 14 may be removed from the vacuum chamber 11 and brought into contact with each other by means of an equipment or jig as shown in FIG. 9A, and the bodies 13 and 14 in this contact state be heated in a heat treatment chamber 70 at an adequate temperature for a predetermined time period, so that water molecules adsorbed on the bonding surfaces are removed and the contact is thus improved. This heat treatment chamber 70 may be a vacuum chamber 11 and the removal of the water molecules from the bonding interface may be conducted by any other methods.

Although aluminum and silicon are used as the materials of the bodies 13 and 14 to be bonded in the above embodiments, the materials to be bonded may be any materials which can adsorb hydroxide groups. The materials to be bonded may be any materials which have an affinity with oxygen atoms or which can form an oxide layer on the surface thereof.

Further, when a body of a hard material is broken by accident, if the split parts (broken bodies) are not plastically deformed, the split parts can be directly bonded together by the present invention to repair the body as long as the broken surfaces of the split parts have complementarily corresponding surface structures and can be brought into intimate contact. Thus, the present invention can be used as a repair technique.

Although the hydroxide groups are adsorbed onto both surfaces of the bodies to be bonded 13 and 14 in the above embodiments, hydroxide groups may be adsorbed onto only the surface of one body and the surface of the other one body may be only cleaned without adsorbing hydroxide groups, if necessary, which is in some cases enough to obtain the direct bonding by the present invention.

The hydroxide group adsorbing may be caused not only by an electromagnetic field but also by other means such as a magnetic field or supersonic waves within the spirit of the present invention. The degree of the vacuum may be lower, to about atmospheric pressure (negative pressure), so long as the apparatus allows cleaning of the surfaces of the bodies by application of an ion beam or the like, adsorption of only hydroxide groups on the surfaces of the bodies, and bonding while avoiding contamination under such a pressure. The mechanism for bringing the bodies into contact may be other ones, including automated ones, than those discussed above.

We claim:

1. A method for direct bonding of two bodies of at least one material, said method comprising:
   a first step of preparing two bodies having surfaces which complementarily correspond to each other and which can come into intimate contact with each other and cleaning said surfaces of the bodies in a vacuum atmosphere;
   a second step of causing said cleaned surface of at least one of said bodies to chemically adsorb hydroxide groups; and
   a third step of bringing said surfaces of said bodies into contact with each other and bonding said bodies through hydrogen bonds between the hydroxide groups on said surface of said at least one body and oxygen atoms present on said surface of the other body.

2. A method according to claim 1, wherein said first step is conducted by one of ion etching and sputter etching.

3. A method according to claim 1, wherein said second step comprises
   a fourth step of spraying water molecules onto said at least one surface of said bodies in a vacuum to cause water molecules and hydroxide groups adsorbed onto said at least one surface of said bodies, and
   a fifth step of applying an energy to said at least one surface of said bodies, said energy being only as high as necessary to remove the water molecules from said at least one surface of said bodies so that hydroxide groups remain on said at least one surface of said bodies.

4. A method according to claim 3, wherein said fifth step is conducted by applying one of a plasma beam and a microwave to said at least one surface of said bodies.

5. A method according to claim 3, wherein said fifth step is conducted by applying one of radio frequency waves and a DC voltage onto at least one of said bodies so as to decompose and remove the water molecules from said at least one surface of said bodies by the effect of an electromagnetic field generated by the radio frequency waves or DC voltage, and so that hydroxide groups remain on said at least one surface of said bodies.

6. A method according to claim 1, wherein said second step comprises
   creating a plasma beam comprising ions of an inert gas for generating plasma and at least one hydrogen-containing reactive gas, and
   applying said plasma beam to said at least one surface of said bodies to cause said at least one surface of said bodies to adsorb hydroxide groups.

7. A method according to claim 1, wherein said second step comprises applying one of radio frequency waves and a direct electric current to water molecules to decompose the water molecules into hydroxide groups by an electromagnetic field generated thereby or a plasma energy generated by said electromagnetic field, and spraying the formed hydroxide groups onto said at least one surface of said bodies to adsorb the formed hydroxide groups by said at least one surface of said bodies.

8. A method according to claim 1, wherein said second and third steps comprise:
   applying water molecules onto said at least one surface of said bodies in a vacuum to cause the water molecules to be adsorbed onto said at least one surface of said bodies, then
   bringing said surfaces of the bodies into contact with each other with the water molecules being present between said surfaces of the bodies, and then
   applying one of a radio frequency and a direct electric current to said bodies to remove water molecules from the surfaces of the bodies by the effect of an electromagnetic field generated thereby, to thereby bond said bodies.

9. A method according to claim 1, wherein said bodies have surfaces which are preliminarily mirror polished.

10. A method according to claim 1, wherein said bodies have surfaces which are split from a body without a plastic deformation and which complementarily correspond to each other and can come into intimate contact with each other.

11. A method according to claim 1, wherein said second step comprises introducing water vapor into the vacuum atmosphere, ionizing the water vapor and spraying the ionized water vapor onto said at least one surface of said bodies, to thereby cause the hydroxide groups to be adsorbed onto said at least one surface of said bodies.

12. A method according to claim 1, wherein said third step comprises after said second step, bringing said surfaces of the bodies into contact with each other by means of contacting equipment, and heating said bodies in a heating chamber to remove water molecules present between the contacted surfaces of the bodies.

13. An apparatus for direct bonding of two bodies of at least one material, comprising:

a vacuum chamber;

a first means for holding two bodies to be bonded while surfaces of the bodies are exposed and for, by subsequent operation, bringing said surfaces of the bodies into contact with each other in the vacuum chamber;

a second means for causing the surfaces of the bodies to adsorb hydroxide groups in the vacuum chamber; and a third means for operating said first means to bring said surfaces of the bodies into contact with each other in the vacuum chamber.

14. An apparatus according to claim 13, wherein said second means comprises a means for spraying water molecules onto at least one of the surfaces of the bodies, and a means for applying a beam of an inert gas plasma generated by microwaves to said at least one surface of the bodies.

15. An apparatus according to claim 13, wherein said second means comprises a plasma generating means for generating plasma of an inert gas and applying a beam of the generated plasma to at least one of the surfaces of the bodies, and a means for introducing at least one reactive gas including hydrogen to said plasma generating means to generate said plasma beam comprising ions of said at least one gas.

16. An apparatus according to claim 13, wherein said second means comprises a means for spraying water molecules onto at least one of the surfaces of the bodies, and a means for applying a radio frequency wave or direct electric current to said water molecules spraying means so as to decompose the water molecules to hydroxide groups by a magnetoelectric field of said radio frequency waves or direct electric current or by a plasma energy generated by said magnetoelectric field and for spraying the formed hydroxide groups from a nozzle of said spraying means to the at least one of the surfaces of the bodies.

17. An apparatus according to claim 13, wherein said second means comprises a means for spraying water molecules onto at least one of the surfaces of the bodies, and a means for applying a radio frequency wave or direct electric current through the first means to said bodies so as to decompose and remove the water molecules on said at least one of the surfaces of the bodies.

18. An apparatus according to claim 13, wherein said second means comprises a pure water tank from which water vapor is introduced into the vacuum chamber, and a means for ionizing the water vapor, and spraying said ionized water vapor onto said at least one of the surfaces of the bodies so that hydroxide groups are adsorbed on the said at least one of the surfaces of the bodies.

* * * * *